US012784813B2

(12) United States Patent
Kadowaki

(10) Patent No.: US 12,784,813 B2
(45) Date of Patent: Nov. 3, 2026

(54) SEMICONDUCTOR MEMORY DEVICE AND CONTROL METHOD THEREOF FORSETTING VOLTAGE OF BIT LINE

(71) Applicant: Winbond Electronics Corp., Taichung City (TW)

(72) Inventor: Takuya Kadowaki, Yokohama (JP)

(73) Assignee: WINBOND ELECTRONICS CORP., Taichung City (TW)

( * ) Notice: Subject to any disclaimer, the term of this patent is extended or adjusted under 35 U.S.C. 154(b) by 93 days.

(21) Appl. No.: 18/930,278

(22) Filed: Oct. 29, 2024

(65) Prior Publication Data

US 2025/0191645 A1 Jun. 12, 2025

(30) Foreign Application Priority Data

Dec. 12, 2023 (JP) ................................ 2023-209063

(51) Int. Cl.
*G11C 11/4091* (2006.01)

(52) U.S. Cl.
CPC ................................ *G11C 11/4091* (2013.01)

(58) Field of Classification Search
CPC ................................................ G11C 11/4091
USPC ........................................................ 365/207
See application file for complete search history.

(56) References Cited

U.S. PATENT DOCUMENTS 5,299,154 A * 3/1994 Oowaki ............. G11C 11/4091 365/189.09
2012/0324413 A1 12/2012 Sheffield
2013/0339571 A1* 12/2013 Cernea ................ G06F 12/0238 711/102
2015/0262650 A1* 9/2015 Okahiro ............. G11C 11/4074 365/189.011
2018/0061486 A1 3/2018 Itoh

FOREIGN PATENT DOCUMENTS

| | | | |
|---|---|---|---|
| JP | 7-85662 | A | 3/1995 |
| JP | 8-139290 | A | 5/1996 |
| JP | 2015-176617 | A | 10/2015 |
| TW | I624035 | B | 5/2018 |
| TW | I721209 | B | 3/2021 |

OTHER PUBLICATIONS

Japanese Office Action for Japanese Application No. 2023-209063, dated Jan. 28, 2025, with English translation.

* cited by examiner

*Primary Examiner* — Alexander Sofocleous
*Assistant Examiner* — Duy H Luong
(74) *Attorney, Agent, or Firm* — Birch, Stewart, Kolasch & Birch, LLP

(57) ABSTRACT

A semiconductor memory device and a control method thereof are provided, which can reduce the leakage current generated in the sense amplifier in the state of holding data. The semiconductor memory device in this application includes a sense amplifier and a control unit. The sense amplifier is connected to a pair of bit lines, and the sense amplifier includes at least one transistor connected to a low-voltage power supply side bit line among a pair of bit lines. When the predetermined operation is not performed and the sense amplifier holds data, the control unit sets the voltage of the low-voltage power supply side bit line to a predetermined voltage which is higher than the low-voltage power supply voltage.

12 Claims, 4 Drawing Sheets

SEMICONDUCTOR MEMORY DEVICE AND CONTROL METHOD THEREOF FORSETTING VOLTAGE OF BIT LINE

CROSS REFERENCE TO RELATED APPLICATIONS

This application claims priority of Japanese Patent Application No. 2023-209063, filed on Dec. 12, 2023, the entirety of which is incorporated by reference herein.

BACKGROUND OF THE INVENTION

Field of the Invention

The present invention relates to a semiconductor memory device and its control method.

Description of the Related Art

A semiconductor memory device, such as Dynamic Random Access Memory (DRAM), generates a weak potential difference on a pair of bit lines based on the data stored in the memory unit, and amplifies this potential difference through a sense amplifier for data reading. Most sense amplifiers include a known pair of N-channel field-effect transistors (nMOSFET) and a pair of P-channel field-effect transistors (pMOSFET), as described in Japanese Laid-Open Patent No. 08-139290.

BRIEF SUMMARY OF THE INVENTION

The operating voltage of semiconductor memory devices decreases as these devices become more power-efficient. With this reduction in operating voltage, the threshold voltage of the transistors inside the sense amplifier also decreases. Furthermore, in the state where the sense amplifier holds data (the state after sensing data), if the voltage of the low-voltage power supply side bit line is set to 0V, at least one transistor connected to the low-voltage power supply side bit line experiences a gate-source voltage of 0V. However, when the threshold voltage of the transistor decreases, the leakage current generated in the transistor with a gate-source voltage of 0V in the state where the sense amplifier holds data may increase.

In light of the above issues, the present invention provides a semiconductor memory device and its control method that can reduce the leakage current generated in the sense amplifier during the data retention state.

The present invention provides a semiconductor memory device comprising: a sense amplifier and a control unit. The sense amplifier is connected to a pair of bit lines and includes at least one transistor connected to the low-voltage power supply side bit line of the pair of bit lines. When no predetermined operation is being performed and the sense amplifier holds the data state, the control unit sets the voltage of the low-voltage power supply side bit line to a predetermined voltage, wherein the predetermined voltage is higher than the low-voltage power supply voltage.

According to the present invention, when no predetermined operation is being performed and the sense amplifier holds the data state, the voltage of the low-voltage power supply side bit line is set to the predetermined voltage. For example, when the low-voltage power supply voltage is 0V, the gate-source voltage of the transistor becomes 0V, causing the back gate-source voltage of this transistor to become negative. As a result of the reverse bias effect, the threshold voltage of this transistor increases, thereby reducing the leakage current generated by this transistor. Consequently, the leakage current generated in the sense amplifier during the data retention state can be reduced.

Additionally, the present disclosure provides a control method for a semiconductor memory device, wherein the semiconductor memory device includes a sense amplifier connected to a pair of bit lines and includes at least one transistor connected to the low-voltage power supply side bit line of the pair of bit lines. When no predetermined operation is being performed and the sense amplifier holds the data state, the control unit of the semiconductor memory device executes the step of setting the voltage of the low-voltage power supply side bit line to the predetermined voltage.

DETAILED DESCRIPTION OF THE INVENTION

Figure 1:
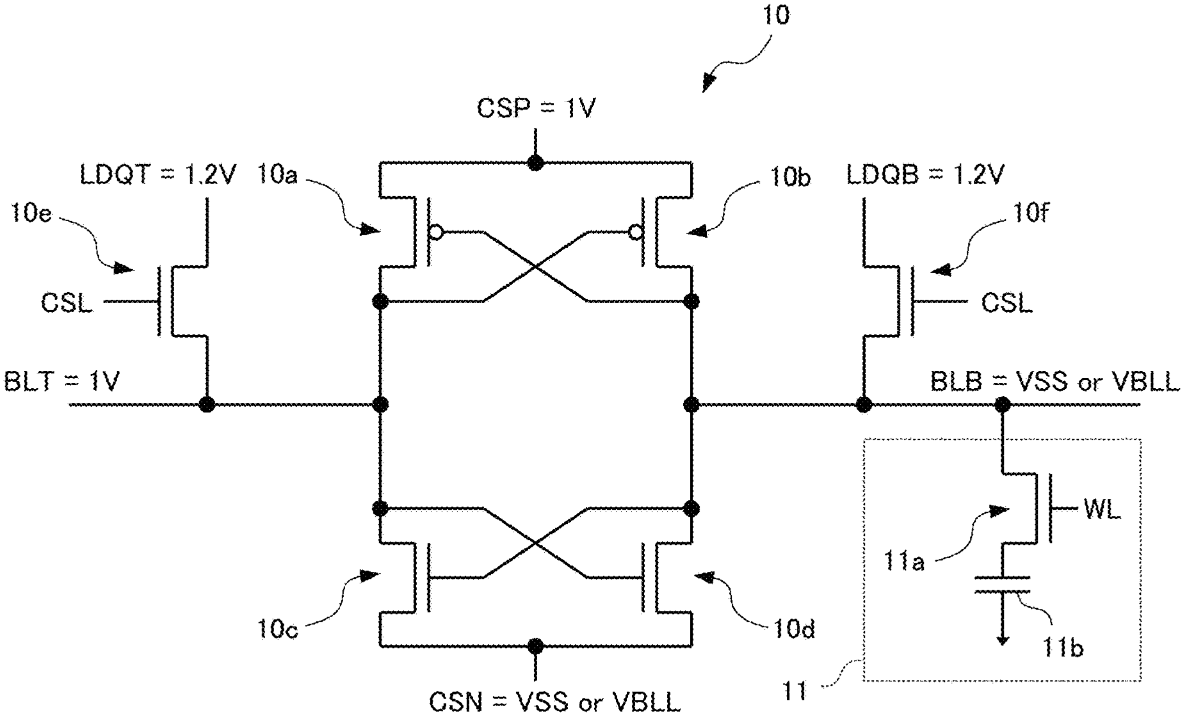
FIG. 1 shows a schematic diagram illustrating a configuration example of a semiconductor memory device according to an embodiment of the present invention.
Figure 2:
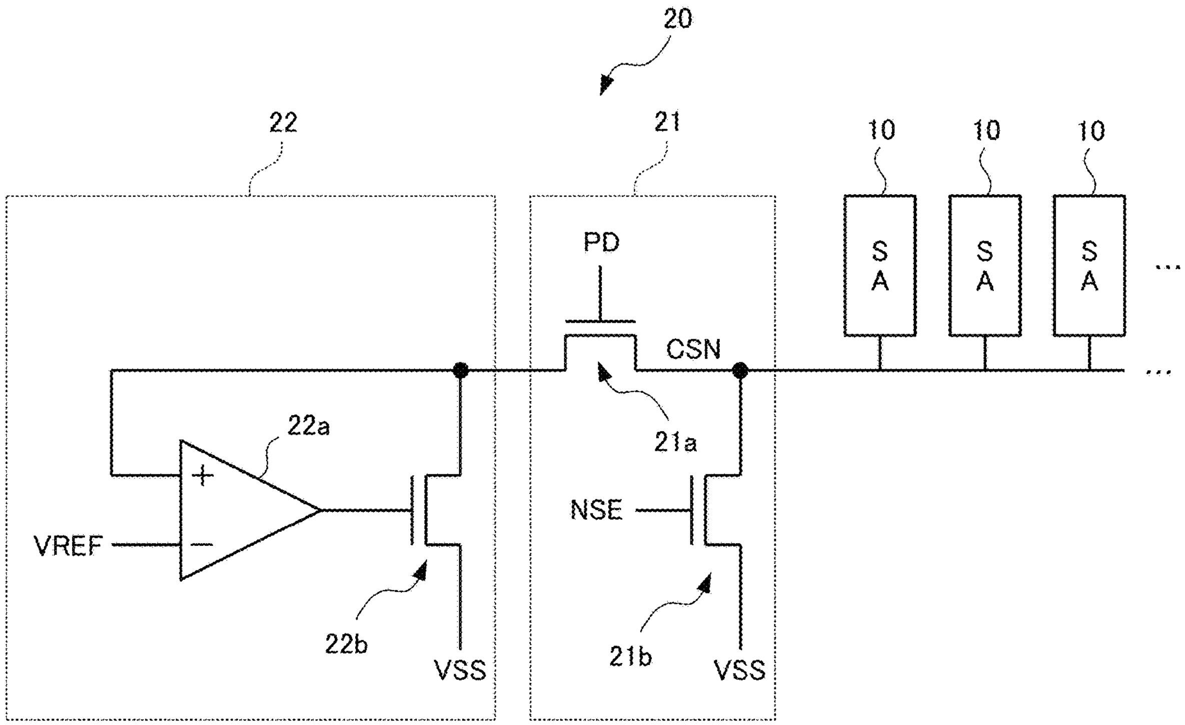
FIG. 2 shows a schematic diagram illustrating a configuration example of a control unit.

As shown in FIGS. 1 and 2, the semiconductor memory device includes at least one sense amplifier 10 and a control unit 20 connected to a pair of complementary bit lines BLT and BLB. In addition, to simplify the explanation, other known components in the semiconductor memory device (such as power circuits, command decoders, address decoders, clock generators, etc.) are not described in detail in this embodiment.

In this embodiment, the semiconductor memory device is described as DRAM, but it may also be other types of semiconductor memory devices (such as Static Random Access Memory (SRAM), or flash memory, etc.).

The sense amplifier 10 is a cross-coupled latch type sensing amplifier, as shown in FIG. 1, and includes a pair of pMOSFETs (10*a*, 10*b*) and a pair of nMOSFETs (10*c*, 10*d*). Here, pMOSFETs 10*a* and 10*b* are examples of “a pair of first transistors” in the present invention, while nMOSFETs 10*c* and 10*d* are examples of “a pair of second transistors” in the present invention.

In the pair of pMOSFETs 10*a* and 10*b*, the source terminal of pMOSFET 10*a* is connected to the high-voltage power supply node CSP, the drain terminal is connected to the high-voltage power supply bit line BLT, and the gate terminal is connected to the low-voltage power supply bit line BLB. In the pair of pMOSFETs 10*a* and 10*b*, the source terminal of the other pMOSFET 10*b* is connected to the high-voltage power supply node CSP, the drain terminal is connected to the low-voltage power supply bit line BLB, and the gate terminal is connected to the high-voltage power supply bit line BLT. Additionally, in this embodiment, the high-voltage power supply voltage is set to 1V, while the low-voltage power supply voltage VSS is set to 0V for illustration.

In the pair of nMOSFETs 10*c* and 10*d*, the drain terminal of one nMOSFET 10*c* is connected to the high-voltage power supply bit line BLT, the source terminal is connected to the low-voltage power side node CSN, and the gate terminal is connected to the low-voltage power supply bit line BLB. Additionally, in the pair of nMOSFETs 10*c* and 10*d*, the drain terminal of the other nMOSFET 10*d* is connected to the low-voltage power supply bit line BLB, the source terminal is connected to the low-voltage power side node CSN, and the gate terminal is connected to the high-voltage power supply bit line BLT.

Additionally, the high-voltage power supply bit line BLT is connected to a local data line LDQT in a pair of complementary local data lines (LDQT, LDQB) via an nMOSFET 10*e* (whose gate terminal input corresponds to the column selection signal CSL of the column address input from the outside). The low-voltage power supply bit line BLB is connected to the other local data line LDQB via nMOSFET 10*f* (whose gate terminal input column select signal CSL). Furthermore, a memory unit 11 is also connected to the low-voltage power supply side bit line BLB. Memory unit 11 can include a known configuration such as an nMOSFET 11*a* with the row selection signal WL input to its gate terminal and a capacitor 11*b*.

Additionally, the structure of the sense amplifier 10 shown in FIG. 1 is just one example; the sense amplifier 10 may include other circuits not depicted in FIG. 1 (such as equalization circuits, etc.).

Here, if the voltage of the low-voltage power supply side bit line BLB (of the pair of bit lines BLT and BLB) is set to 0V while the sense amplifier 10 is in a data hold state (the state after sensing data), the gate-source voltages of pMOSFET 10*b*, nMOSFET 10*c*, and nMOSFET 10*f* will be 0V. In this state, with the low power consumption of the semiconductor memory device, the operating voltage of the semiconductor memory device decreases, and the threshold voltages of pMOSFET 10*b*, nMOSFET 10*c*, and nMOSFET 10*f* will also decrease. In the data hold state of the sense amplifier, the leakage currents generated by pMOSFET 10*b*, nMOSFET 10*c*, and nMOSFET 10*f* may increase. Therefore, in this embodiment, during the data hold state of the sense amplifier, the voltage of the low-voltage power supply side bit line BLB is set to a predetermined voltage VBLL. The predetermined voltage VBLL is higher than the low-voltage power supply voltage VSS (which, for example, may be 0V).

Referring to FIG. 2, an example of the configuration of the control unit 20 is described. In the state where no predetermined operation is being performed and the sense amplifier 10 is in a data hold state, the control unit 20 is configured to set the voltage of the low-voltage power supply side bit line BLB to the predetermined voltage VBLL.

Additionally, when performing a predetermined operation with the voltage of the low-voltage power supply side bit line BLB set to the predetermined voltage VBLL, the control unit 20 can set the voltage of the low-voltage power supply side bit line BLB to the low-voltage power supply voltage VSS. Thus, during the execution of the predetermined operation, the voltage of the low-voltage power supply side bit line BLB is set to the low-voltage power supply voltage VSS, allowing the predetermined operation to be carried out normally.

Here, the predetermined operation may include at least one of the following: reading the data stored in memory unit 11, writing data to the memory unit 11 connected to the sense amplifier 10, and precharging the pair of bit lines BLT and BLB. Thus, when not performing at least one of the reading the data stored in memory unit 11, writing data to memory unit 11, and precharging the pair of bit lines BLT and BLB, the voltage of the low-voltage power supply side bit line BLB can be set to the predetermined voltage VBLL.

Additionally, the predetermined voltage VBLL can be set lower than the voltage (which is 1V in this embodiment) of the high voltage power side bit line BLT. This allows for the generation of a potential difference between the pair of bit lines BLT and BLB while the sense amplifier 10 is in a data hold state.

As shown in FIG. 2, the control unit 20 includes a first supply unit 21 and a second supply unit 22. The first supply unit 21 supplies the lower voltage power supply voltage VSS to the low-voltage power supply side bit line BLB. The second supply unit 22 supplies the predetermined voltage VBLL to the low-voltage power supply side bit line BLB when no predetermined operation is being performed.

The first supply unit 21 includes a first switch unit 21*a* and a second switch unit 21*b*. When the first control signal PD, indicating that no predetermined operation is being performed, is input, the first switch unit 21*a* supplies the predetermined voltage VBLL from the second supply unit 22 to the low-voltage power supply side bit line BLB. When the second control signal NSE (indicating that a predetermined operation is being performed) is input, the second switch unit 21*b* supplies the lower voltage power supply voltage VSS to the low-voltage power supply side bit line BLB.

In this embodiment, the first switch unit 21*a* is composed of an nMOSFET. The drain terminal of this nMOSFET is connected to the low-voltage power side node CSN of each sense amplifier 10, and the source terminal is connected to the second supply unit 22. Additionally, the first control signal PD is input to the gate terminal of this nMOSFET. When a high-level first control signal PD, indicating that no predetermined operation is being performed, is input to the gate terminal, the first switch unit 21*a* supplies the predetermined voltage VBLL from the second supply unit 22 to the low-voltage power side node CSN of each sense amplifier 10. Subsequently, the predetermined voltage VBLL is supplied to the low-voltage power supply side bit line BLB.

In this embodiment, the second switch unit 21*b* is composed of an nMOSFET. The drain terminal of this nMOSFET is connected to the low-voltage power side node CSN of each sense amplifier 10, and the source terminal is connected to the low-voltage power supply voltage VSS. Additionally, the second control signal NSE is input to the gate terminal of this nMOSFET. When a high-level second control signal NSE (indicating that a predetermined operation is being performed) is input to the gate terminal, the second switch unit 21*b* supplies the low-voltage power supply voltage VSS to the low-voltage power side node CSN of each sense amplifier 10. Subsequently, the low-voltage power supply voltage VSS is supplied to the low-voltage power supply side bit line BLB.

Additionally, the first control signal PD and the second control signal NSE can be complementary signals. Furthermore, the first control signal PD and the second control signal NSE can be generated within the control unit 20 or by other circuits set up in the semiconductor memory device.

The second supply unit 22 includes a comparator 22*a* and a switch unit 22*b*. The comparator 22*a* has a first terminal (positive terminal) and a second terminal (negative terminal). The voltage of the low-voltage power supply side bit line BLB (connected to the low-voltage power side node CSN of each sense amplifier 10) is input to the first terminal, while the reference voltage VREF (equal to predetermined voltage VBLL) is input to the second terminal. Additionally, the output terminal of the comparator 22*a* is connected to the switch unit 22*b*. In this embodiment, the switch unit 22*b* is composed of an nMOSFET. The drain terminal of this nMOSFET is connected to the low-voltage power side node CSN of each sense amplifier 10 via the first switch unit 21*a* of the first supply unit 21. The source terminal is connected to the low-voltage power supply voltage VSS. Additionally, the signal output from the comparator 22*a* is input to the gate terminal of this nMOSFET. This structure allows the second supply unit 22 to output the predetermined voltage VBLL.

Figure 3:
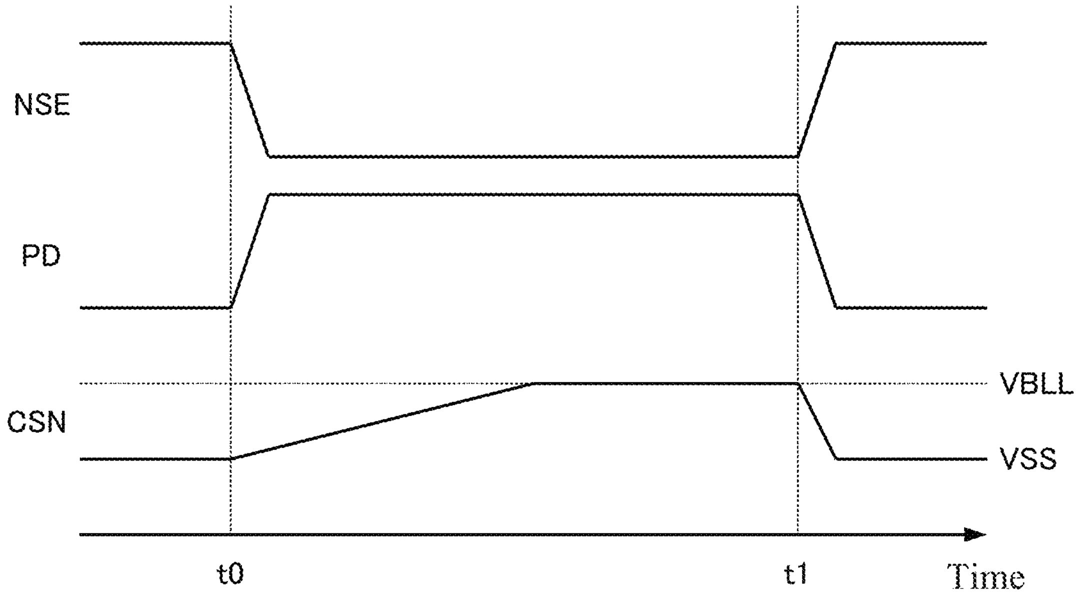
FIG. 3 shows a schematic diagram illustrating an example of the variations in control signals and the bit line voltage on the low voltage power supply side.

Referring to FIG. 3, an example of the operation of the control unit 20 is described. Here, first, let's assume that a predetermined operation is being performed in the semiconductor memory device (at least one of the following: reading data stored in the memory unit 11, writing data to the memory unit 11, and precharging the pair of bit lines BLT and BLB). In this case, the first control signal PD is at a low level, while the second control signal NSE is at a high level. At this time, the control unit 20 supplies the low-voltage power supply voltage VSS to the low-voltage power side node CSN of each sense amplifier 10. Thus, the low-voltage power supply voltage VSS is supplied to the low-voltage power supply side bit line BLB.

Next, after the predetermined operation has ended (when no predetermined operation is being performed) and the sense amplifier 10 is in a data hold state, at time t0, the first control signal PD transitions to a high level, and the second control signal NSE transitions to a low level. At this time, the control unit 20 supplies the predetermined voltage VBLL to the low-voltage power side node CSN of each sense amplifier 10. Consequently, the predetermined voltage VBLL is supplied to the low-voltage power supply side bit line BLB.

In this case, when no predetermined operation is being performed and the sense amplifier 10 is in a data hold state, the voltage of the low-voltage power supply side bit line BLB is set to the predetermined voltage VBLL. For example, when the low-voltage power supply voltage VSS is 0V, the back gate-source voltage of the transistors (such as nMOSFET 10*c* and nMOSFET 10*f* in FIG. 1) with the gate-source voltage of 0V becomes a negative voltage. As a result, the threshold voltage of transistors 10*c* and 10*f* increases due to the reverse bias effect, leading to a reduction in the leakage current generated in these transistors.

Next, when a predetermined operation is being performed (at least one of the following: reading data stored in the memory unit 11, writing data to the memory unit 11, and precharging the pair of bit lines BLT and BLB) at time t1, the first control signal PD transitions to a low level. The second control signal NSE transitions to a high level. At this time, the control unit 20 supplies the low-voltage power supply voltage VSS to the low-voltage power side node CSN of each sense amplifier 10. Thus, since the voltage of the low-voltage power supply side bit line BLB is set to voltage VSS during the predetermined operation, the predetermined operation can be carried out normally.

As described above, in the semiconductor memory device and its control method according to this embodiment, when no predetermined operation is being performed and the sense amplifier 10 is in a data hold state, by setting the voltage of the low-voltage power supply side bit line BLB to the predetermined voltage VBLL. For example, when the low-voltage power supply voltage is 0V, the back gate-source voltage of transistors (such as nMOSFET 10*c* and nMOSFET 10*f* in FIG. 1) with a gate-source voltage of 0V becomes negative. As a result, the threshold voltage of transistors 10*c* and 10*f* increases due to the reverse bias effect, leading to a reduction in the leakage current generated in these transistors. Additionally, in nMOSFET 10*f*, the gate-source voltage becomes negative, resulting in a reduction in the leakage current generated in nMOSFET 10*f*. Consequently, the leakage current produced in the sense amplifier 10 while in the data hold state can be decreased.

The above embodiment is provided solely for the purpose of illustrating the invention for better understanding and is not intended to limit the invention. Therefore, all elements disclosed in the above embodiment include any design modifications and equivalents that fall within the technical scope of the invention.

Figure 4:
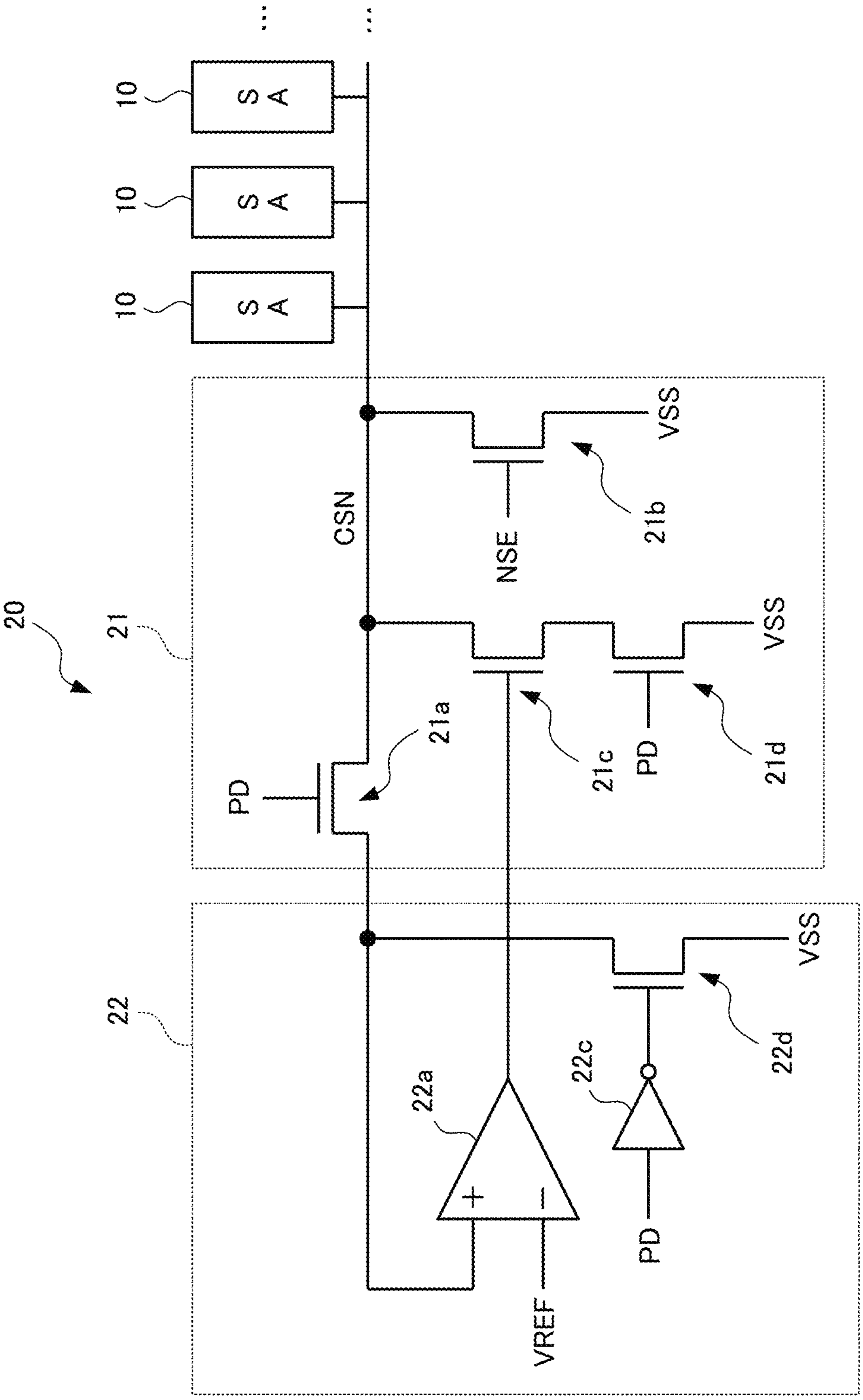
FIG. 4 shows a schematic diagram illustrating another configuration example of the control unit.

For example, in the above embodiment, the control unit 20 is described with the configuration shown in FIG. 2 as an example, but the invention is not limited thereto. For instance, the control unit 20 can have another configuration as shown in FIG. 4. Referring to FIG. 4, the first supply unit 21 of the control unit 20 includes a first switch unit 21*a*, a second switch unit 21*b*, a third switch unit 21*c*, and a fourth switch unit 21*d*. Here, the configurations of the first switch unit 21*a* and the second switch unit 21*b* are the same as those in the above embodiment.

The third switch unit 21*c* is composed of an nMOSFET. The drain terminal of this nMOSFET is connected to the low-voltage power side node CSN of each sense amplifier 10, while the source terminal is connected to the drain terminal of the nMOSFET that forms the fourth switch unit 21*d*. Additionally, the signal output from the comparator 22*a* of the second supply unit 22 is input to the gate terminal.

The fourth switch unit 21*d* is composed of an nMOSFET. The drain terminal of this nMOSFET is connected to the source terminal of the third switch unit 21*c*, while the source terminal is connected to the low-voltage power supply voltage VSS. Additionally, the first control signal PD is input to the gate terminal of this nMOSFET.

Additionally, the second supply unit 22 of the control unit 20 shown in FIG. 4 includes a comparator 22*a*, a NOT circuit 22*c*, and a switch unit 22*d*. Here, the structure of the comparator 22*a* is the same as in the above embodiment. The NOT circuit 22*c* inputs the first control signal PD. The switch unit 22*d* is composed of an nMOSFET. The drain terminal of this nMOSFET is connected to the low-voltage power side node CSN of each sense amplifier 10 via the first switch unit 21*a* of the first supply unit 21. The source terminal of this nMOSFET is connected to the low-voltage power supply voltage VSS. Additionally, the signal output from the NOT circuit 22*c* is input to the gate terminal of this nMOSFET.

As shown in FIG. 4, the control unit 20 with this structure can operate in the same manner as the above embodiment when the control signals PD and NSE are input.

Additionally, in the examples shown in FIG. 2 and FIG. 4, the various switch units 21*a*, 21*b*, 21*c*, 21*d*, 22*b*, and 22*d* are described as being composed of MOSFETs, but the invention is not limited to this. For example, each switch unit 21*a*, 21*b*, 21*c*, 21*d*, 22*b*, and 22*d* can be composed of other types of transistors besides MOSFETs, or can be composed of components or circuits other than transistors.

Additionally, in the examples shown in FIG. 2 and FIG. 4, the control unit 20 is described as having a first supply unit 21 and a second supply unit 22, but the invention is not limited to thereto. For example, the control unit 20 can have multiple first supply units 21 and a second supply unit 22. In this case, the multiple first supply units 21 are connected to the low voltage power side nodes CSN of multiple sense amplifiers 10 in the same manner as shown in FIG. 2 and FIG. 4, while a second supply unit 22 is connected to the multiple first supply units 21. Thus, a second supply unit 22 can supply the predetermined voltage VBLL to the low-voltage power supply side bit line BLB through each of the multiple first supply units 21.

Additionally, the structures of the sense amplifier 10 and the control unit 20 in the above embodiment are provided as examples and can be suitably modified or replaced with various other structures.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device, comprising:
- a sense amplifier, connected to a pair of bit lines, and including at least one transistor connected to a low voltage power side bit line of the pair of bit lines; and
- a control unit, configured to set a voltage of the low voltage power side bit line to a predetermined voltage higher than a low-voltage power supply voltage when no predetermined operation is performed and the sense amplifier is in a data hold state;
- wherein the control unit comprises:
  - at least one first supply unit, comprising:
    - a first switch unit, having a first terminal and a second terminal;
    - a second switch unit, having a third terminal coupled to the second terminal and a fourth terminal coupled to the low-voltage power supply voltage;
    - a third switch unit, having a fifth terminal coupled to the second terminal and a sixth terminal; and
    - a fourth switch unit, having a seventh terminal coupled to the sixth terminal and an eighth terminal coupled to the low-voltage power supply voltage; and
  - a second supply unit, comprising:
    - a comparator, having a ninth terminal coupled to the first terminal, a tenth terminal receiving the predetermined voltage, and an output terminal coupled to a gate of the third switch unit;
    - a NOT circuit, having an input terminal receiving a first control signal and an output terminal; and
    - a switch unit, having an eleventh terminal coupled to the first terminal and a twelfth terminal coupled to the low-voltage power supply voltage, wherein a gate of the switch unit is coupled to the output terminal of the NOT circuit.

2. The semiconductor memory device as claimed in claim 1, wherein when the predetermined operation is being performed while the voltage of the low voltage power side bit line is set to the predetermined voltage, the control unit sets the voltage of the low voltage power side bit line to the low-voltage power supply voltage.

3. The semiconductor memory device as claimed in claim 1, wherein the predetermined operation includes at least one of the following: reading data stored in a memory unit connected to the sense amplifier, writing data to the memory unit, and precharging the pair of bit lines.

4. The semiconductor memory device as claimed in claim 1, wherein:
- the at least one first supply unit is configured to supply the low-voltage power supply voltage to the low voltage power side bit line; and
- the second supply unit is configured to supply the predetermined voltage to the low voltage power side bit line when no predetermined operation is being performed.

5. The semiconductor memory device as claimed in claim 4, wherein:
- the first switch unit is configured to supply the predetermined voltage provided by the second supply unit to the low voltage power side bit line when the first control signal indicating that no predetermined operation is being performed is input; and
- the second switch unit is configured to supply the low-voltage power supply voltage to the low voltage power side bit line when a second control signal indicating that the predetermined operation is performed is input.

6. The semiconductor memory device as claimed in claim 4 wherein:
- the voltage of the low voltage power side bit line is input to the ninth terminal.

7. The semiconductor memory device as claimed in claim 5, wherein:
- the voltage of the low voltage power side bit line is input to the ninth terminal.

8. The semiconductor memory device as claimed in claim 1, wherein the predetermined voltage is lower than a voltage of a high voltage power side bit line of the pair of bit lines.

9. The semiconductor memory device as claimed in claim 1, wherein the sense amplifier includes:
- a pair of first transistors, wherein one of the first transistors is connected to the high voltage power supply side bit line, and the other first transistor is connected to the low-voltage power supply side bit line; and
- a pair of second transistors, wherein one of the second transistors is connected to the high voltage power supply side bit line, and the other second transistor is connected to the low-voltage power supply side bit line.

10. The semiconductor memory device as claimed in claim 8, wherein one of the pair of first transistors and one of the pair of second transistors are nMOSFETs, and the other of the pairs of the first transistors and the other of the pairs of second transistors are pMOSFETs.

11. The semiconductor memory device as claimed in claim 1, wherein the low-voltage power supply voltage is OV.

12. A control method for a semiconductor memory device, wherein the semiconductor memory device includes a sense amplifier connected to a pair of bit lines and includes at least one transistor connected to a low-voltage power supply side bit line of the pair of bit lines, wherein the control method comprises:
- performing a step of setting a voltage of the low-voltage power supply side bit line to a predetermined voltage higher than a low-voltage power supply voltage via a control unit of the semiconductor memory device, when no predetermined operation is being performed and the sense amplifier is in a data hold state;
- wherein the control unit comprises:
  - at least one first supply unit, comprising:
    - a first switch unit, having a first terminal and a second terminal;
    - a second switch unit, having a third terminal coupled to the second terminal and a fourth terminal coupled to the low-voltage power supply voltage;
    - a third switch unit, having a fifth terminal coupled to the second terminal and a sixth terminal; and a fourth switch unit, having a seventh terminal coupled to the sixth terminal and an eighth terminal coupled to the low-voltage power supply voltage; and a second supply unit, comprising:

a comparator, having a ninth terminal coupled to the first terminal, a tenth terminal receiving the predetermined voltage, and an output terminal coupled to a gate of the third switch unit;

a NOT circuit, having an input terminal receiving a first control signal and an output terminal; and a switch unit, having an eleventh terminal coupled to the first terminal and a twelfth terminal coupled to the low-voltage power supply voltage, wherein a gate of the switch unit is coupled to the output terminal of the NOT circuit.

* * * * *